US007274625B1

(12) United States Patent
Matsumoto et al.

(10) Patent No.: US 7,274,625 B1
(45) Date of Patent: Sep. 25, 2007

(54) DISPLAY DEVICE

(75) Inventors: Katsumi Matsumoto, Mobara (JP); Kozo Yasuda, Mobara (JP); Hiroshi Kageyama, Hachioji (JP); Hideo Sato, Hitachi (JP); Toshio Miyazawa, Chiba (JP)

(73) Assignee: Hitachi Displays, Ltd., Chiba-ken (JP)

( * ) Notice: Subject to any disclaimer, the term of this patent is extended or adjusted under 35 U.S.C. 154(b) by 0 days.

(21) Appl. No.: 11/700,876

(22) Filed: Feb. 1, 2007

(30) Foreign Application Priority Data

Feb. 9, 2006 (JP) ............................ 2006-032405

(51) Int. Cl.
*G04C 17/00* (2006.01)
*H03K 3/03* (2006.01)
*G09G 3/20* (2006.01)

(52) U.S. Cl. .......................... 368/242; 331/57; 345/55; 345/98

(58) Field of Classification Search .................. 368/82, 368/84, 239, 242; 331/57, 175; 345/208–210, 345/50–55, 98–100; 349/33, 47, 41–42
See application file for complete search history.

(56) References Cited

U.S. PATENT DOCUMENTS 3,639,790 A * 2/1972 Yatsushiro et al. ........... 310/89
5,180,995 A * 1/1993 Hayashi et al. ............... 331/57
5,544,120 A * 8/1996 Kuwagata et al. .......... 365/222
5,712,652 A * 1/1998 Sato et al. ..................... 345/90
5,898,323 A * 4/1999 Suda ........................... 327/66
6,373,341 B1 * 4/2002 Morgan ....................... 331/57
2005/0110592 A1* 5/2005 Lee ............................. 333/16
2005/0243246 A1* 11/2005 Edwards et al. .............. 349/98

* cited by examiner

*Primary Examiner*—Vit W Miska
(74) *Attorney, Agent, or Firm*—Reed Smith LLP; Stanley P. Fisher, Esq.; Juan Carlos A. Marquez, Esq.

(57) ABSTRACT

An oscillator circuit includes (2n+1) inverters connected in series when n is a natural number, an integrator circuit having an input terminal connected to an output terminal of a (2n+1)-th inverter and an output terminal connected to an input terminal of a first inverter, first and second p-type transistors connected in series between the input terminal of the first inverter and a first reference potential, and first and second n-type transistors connected in series between the input terminal of the first inverter and a second reference potential. An output voltage of a j-th inverter is applied to control electrodes of the first p-type transistor and the first n-type transistor. An output voltage of a k-th inverter is applied to control-electrodes of the second p-type transistor and the second n-type transistor. Symbol j is an odd number, k is an even number, and j<k=2n is satisfied.

9 Claims, 3 Drawing Sheets

DISPLAY DEVICE

CLAIM OF PRIORITY

The present application claims priority from Japanese Application JP 2006-032405 filed on Feb. 9, 2006, the content of which is hereby incorporated by reference into this application.

BACKGROUND OF THE INVENTION

1. Field of the Invention

The present invention relates to display devices, and more particularly to a technique that is effectively applied to an oscillator circuit that is built in a display panel.

2. Description of the Related Art

In recent years, a downsized liquid crystal display panel having thin film transistors (hereinafter referred to as "pixel transistors") as active elements of respective pixels has been widely employed as a display section of a mobile device such as a cellular phone.

As the liquid crystal display module, there has been known a liquid crystal display module having the semiconductor layer of the thin film transistors made of polysilicon (hereinafter referred to as "polysilicon liquid crystal display module"). In the polysilicon liquid crystal display module, driver circuits such as a horizontal driver circuit and a vertical driver circuit are integrated with a liquid crystal display panel.

The transistors that constitute the driver circuits are formed of thin film transistors each having a semiconductor layer made of polysilicon (hereinafter referred to as "polysilicon thin film transistor") as with the pixel transistor, and the polysilicon thin film transistors are integrated with the pixel transistors.

SUMMARY OF THE INVENTION

In the liquid crystal display module of the polysilicon type, it is general that a pulse necessary for driving a liquid crystal display panel is supplied from an external driver that is made up of a semiconductor integrated circuit (LSI). However, in the case where various pulses of diverse voltage amplitudes which are used in the driver circuits within the liquid crystal display panel is supplied from the external driver, a dedicated driver is required.

This structure suffers from such problems that the costs of final products increase, the development costs increase, and a development period is extended. In order to eliminate the above problems, an oscillator circuit is disposed within the driver circuits in the liquid crystal display panel, and necessary pulses are generated by the driver circuits with in the liquid crystal display panel.

FIG. 5 is a circuit diagram showing the circuit configuration of a general oscillator circuit.

FIG. 5 shows a ring oscillator circuit having odd CMOS inverters (INV) connected in series. The respective CMOS inverters (INV) are formed of the polysilicon thin film transistors.

In the ring oscillator circuit shown in FIG. 5, when it is assumed that the number of the CMOS inverters (INV) is (2n+1), and a propagation period of each of the CMOS inverters is tpd, oscillations are conducted at a frequency (f) of $f=1/(2\times(2n+1)\times tpd)$.

However, in the CMOS inverter formed of the polysilicon thin film transistor, the manufacture variation of the characteristics of an n-type polysilicon thin film transistor and a p-type polysilicon thin film transistor is larger than that of a general semiconductor integrated circuit (LSI) having the semiconductor layer made of silicon. Therefore, the propagation period (tpd) of the CMOS transistor is varied, and the oscillation frequency of the ring oscillator is finally varied, with the result that the intended purpose is limited.

Also, the circuit shown in FIG. 5 is largely affected by a supply voltage, and the high-precision control of the power supply is required when the circuit is used, which is not realistic.

The present invention has been made to address the problems with the above related art, and therefore an object of the present invention is to provide a technique that is capable of stabilizing the oscillation frequency of the oscillator circuit with a reduction in the influences of the manufacture variation of the thin film transistor and the variation of the supply voltage in a display device.

The above and other objects and novel features of the present invention become apparent from the description of the present invention and the attached drawings.

The typical outlines of the present invention described in the present application will be briefly described as follows.

(1) A display device includes a display panel having a plurality of pixels, and a driver circuit that drives the plurality of pixels, respectively. The driver circuit includes an oscillator circuit. The oscillator circuit includes (2n+1) inverters having a first inverter to a (2n+1)-th inverter which are connected in series when n is an integer of 1 or larger, an integrator circuit having an input terminal connected to an output terminal of the (2n+1)-th inverter and an output terminal connected to an input terminal of the first inverter, first and second p-type transistors which are connected in series between the input terminal of the first inverter and a first reference potential, and first and second n-type transistors which are connected in series between the input terminal of the first inverter and a second reference potential. An output voltage of a j-th inverter is applied to control electrodes of the first p-type transistor and the first n-type transistor. An output voltage of a k-th inverter is applied to control electrodes of the second p-type transistor and the second n-type transistor. Symbol j is an odd number, and k is an even number, and $j<k=2n$ is satisfied.

(2) In the display device according to (1), the integrator circuit includes a resistor element which is connected between the input terminal of the first inverter and the output terminal of the (2n+1)-th inverter, and a capacitor element that is connected between the input terminal of the first inverter and the first reference potential or the second reference potential.

(3) In the display device according to (1), a relationship of $(tdr+tdf)<(tf+tr)$ is satisfied when tdr is a period of time during which a voltage of the input terminal of the first inverter is fixed to the first reference potential, tdf is a period of time during which the voltage of the input terminal of the first inverter is fixed to the second reference potential, tf is a period of time during which the voltage of the input terminal of the first inverter is shifted from the first reference potential to a threshold voltage of the first inverter, and tr is a period of time during which the voltage of the input terminal of the first inverter is shifted from the second reference potential to the threshold voltage of the first inverter.

(4) In the display device according to (1), a relationship of $(tdr+tdf)<<(tf+tr)$ is satisfied when tdr is a period of time during which a voltage of the input terminal of the first inverter is fixed to the first reference potential, tdf is a period of time during which the voltage of the input terminal of the first inverter is fixed to the second reference potential, tf is a period of time during which the voltage of the input terminal of the first inverter is shifted from the first reference potential to a threshold voltage of the first inverter, and tr is a period of time during which the voltage of the input terminal of the first inverter is shifted from the second reference potential to the threshold voltage of the first inverter.

(5) In the display device according to (1), a relationship of (tdr+tdf)/(tdr+tdf+tf+tr)<0.1 is satisfied when tdr is a period of time during which a voltage of the input terminal of the first inverter is fixed to the first reference potential, tdf is a period of time during which the voltage of the input terminal of the first inverter is fixed to the second reference potential, tf is a period of time during which the voltage of the input terminal of the first inverter is shifted from the first reference potential to a threshold voltage of the first inverter, and tr is a period of time during which the voltage of the input terminal of the first inverter is shifted from the second reference potential to the threshold voltage of the first inverter.

(6) In the display device according to (1), each of the pixels has an active element, and the active element includes a thin film transistor having a semiconductor layer made of polysilicon.

(7) In the display device according to (1), each of the inverters includes a thin film transistor having a semiconductor layer made of polysilicon.

(8) In the display device according to (2), the capacitor element and the resistor element are incorporated into the display panel.

(9) The display device according to (2), the capacitor element and the resistor element are externally attached to the display panel.

The advantages exerted by the typical features of the present invention described in the present application will be briefly described below.

According to the display device of the present invention, the influences of the manufacture variation of the thin film transistor and the variation of the supply voltage are reduced, thereby making it possible to stabilize the oscillation frequency of the oscillator circuit.

BRIEF DESCRIPTION OF THE DRAWINGS

These and other objects and advantages of this invention will become more fully apparent from the following detailed description taken with the accompanying drawings in which.

DETAILED DESCRIPTION OF THE PREFERRED EMBODIMENTS

Now, a description will be given in more detail of a liquid crystal display device according to a preferred embodiment of the present invention with reference to the accompanying drawings.

In all of the drawings for explaining the embodiment, parts having the same functions are designated by identical symbols, and the duplicated description will be omitted.

The embodiment of the present invention is directed to a liquid crystal display module for a cellular phone, and a liquid crystal display panel of the liquid crystal display module according to this embodiment has a pair of substrates, and liquid crystal that is nipped between the pair of substrates. On one of the pair of substrates (hereinafter referred to as "TFT substrate") are formed pixel electrodes and thin film transistors of the respective sub-pixels.

Figure 1:
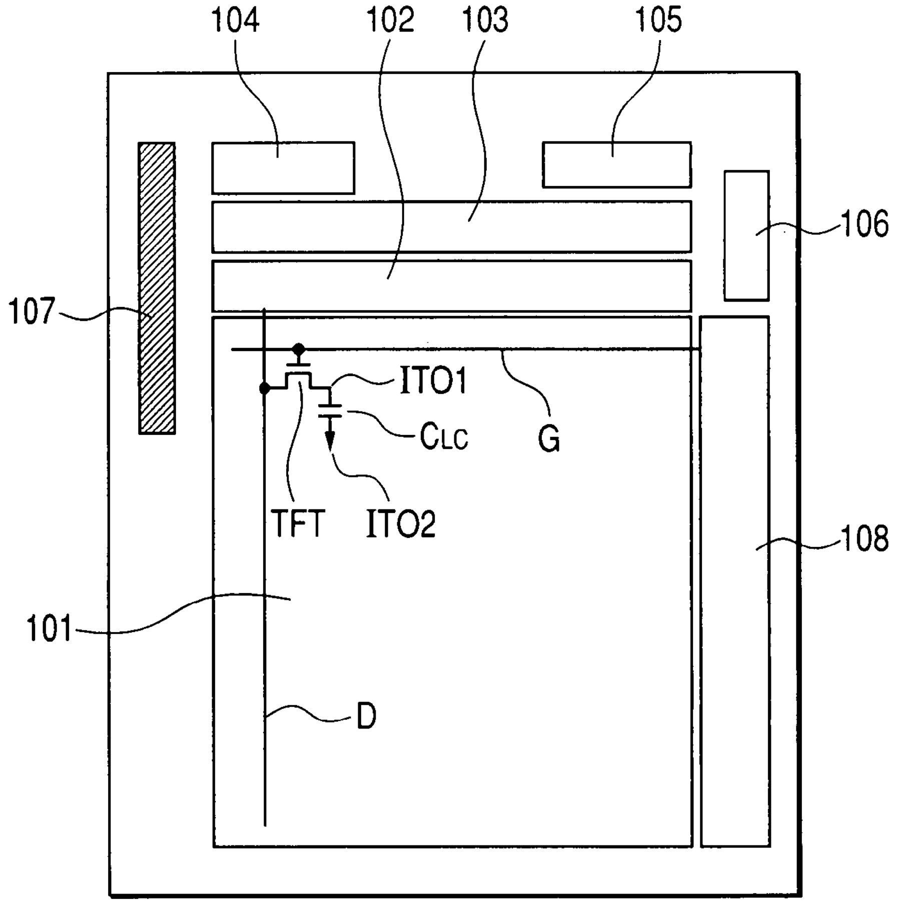
FIG. 1 is a diagram showing the rough configuration of one substrate of a liquid crystal display panel according to an embodiment of the present invention.

FIG. 1 is a diagram showing the rough configuration of a TFT substrate of the liquid crystal panel according to the embodiment of the present invention.

Referring to FIG. 1, reference numeral 101 denotes a pixel array region, and the pixel array region 101 has plural video lines D and plural scanning lines G. The sub-pixels are disposed in regions that are surrounded by the video lines D and the scanning lines G.

Each of the sub-pixels has a thin film transistor TFT that constitutes an active element, and a pixel electrode ITO1 that is connected to the source of the thin film transistor TFT. Since each of the pixel electrodes is opposed to an opposed electrode ITO2 through the liquid crystal, a liquid crystal capacitor CLC is formed between the pixel electrode ITO1 and the opposed electrode ITO2.

The drain of each of the thin film transistors TFT is connected to the video line D that applies a video voltage to each of the pixel electrodes ITO1. The video lines D are connected to a sample and hold circuit 102, and the sample and hold circuit 102 samples video signals on the basis of shift pulses that are outputted from a horizontal scanning circuit 103, and then supplies the sampled video signals to the video lines D as a video voltage.

The gates of the respective thin film transistors TFT are connected to a vertical scanning circuit 108. The vertical scanning circuit 108 scans the scanning lines G from the above toward the below or from the below toward the above, supplies a selected scanning voltage of the high level (hereinafter referred to as "H level") to a selected scanning line G during one horizontal scanning period 1H, and supplies a non-selected scanning voltage of the low level (hereinafter referred to as "L level") to other scanning lines G.

As a result, a thin film transistor TFT having a gate connected to the scanning line G that is applied with the selected scanning voltage turns on, and the video voltage is applied to the pixel electrode ITO1 from the video line D through the thin film transistor TFT, to thereby display an image on the liquid crystal display panel.

Also, a dot cross pulse DCK, a horizontal synchronous signal Hsync, and a vertical synchronous signal Vsync are supplied from the external of the liquid crystal display panel. A horizontal scanning pulse generator circuit 104 generates a horizontal scanning pulse from the dot clock pulse DCK and the horizontal synchronous signal Hsync to output the horizontal scanning pulse to the horizontal scanning circuit 103.

A vertical scanning pulse generator circuit 106 generates a vertical scanning pulse from the vertical synchronous signal Vsync to output the vertical scanning pulse to the vertical scanning circuit 108.

A DC voltage converter circuit 105 generates a DC voltage of a high potential which is used in the vertical scanning circuit 108. The common pulse oscillator circuit 107 generates a common pulse for AC driving the liquid crystal display panel.

The above-mentioned thin film transistor TFT of the pixel has a semiconductor layer made of polysilicon. Also, the transistor within the sample and hold circuit 102, the horizontal scanning circuit 103, the horizontal scanning pulse generator circuit 104, the DC voltage converter circuit 105, the vertical scanning pulse generator circuit 106, the common pulse oscillator circuit 107, or the vertical scanning circuit 108 also has the semiconductor layer made of polysilicon, and those transistors are integrated with the thin film transistor TFT of the pixel.

Figure 2:
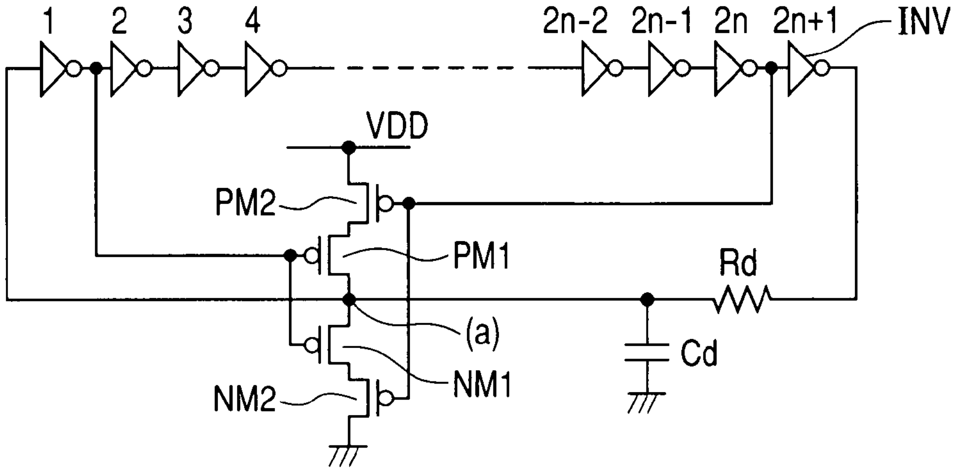
FIG. 2 is a circuit diagram showing the circuit configuration of an oscillator circuit within a common pulse oscillator circuit shown in FIG. 1.

FIG. 2 is a circuit diagram showing the circuit configuration of an oscillator circuit within the common pulse oscillator circuit shown in FIG. 1.

As with the ring oscillator shown in FIG. 5, the oscillator circuit shown in FIG. 2 has (2n+1) CMOS inverters including a first CMOS inverter to a (2n+1)-th CMOS inverter which are connected in series (hereinafter referred to simply as "inverters" (INV)) when n is an integer of 1 or larger. The circuit shown in FIG. 2 further includes an integrator circuit with a resistor element Rd and a capacitor element Cd.

In this example, the resistor element Rd is connected between an output terminal of the (2n+1)-th inverter INV and an input terminal of the first inverter INV, and the capacitor element Cd is connected between the input terminal of the first inverter INV and a grounding potential (a second reference potential). Alternatively, the capacitor element Cd can be connected between the input terminal of the first inverter INV and the supply voltage (a first reference potential; VDD).

In this example, the resistor element Rd and the capacitor element Cd can be integrated with each other during manufacturing of the thin film transistor, and in this case, the resistor element Rd is formed of a resistor layer made of polysilicon, and the capacitor element Cd is formed of an interlayer capacitor. Also, it is possible that the terminal is provided, and the resistor element Rd and the capacitor element Cd are externally configured.

Also, a first p-type thin film transistor PM1 and a second p-type thin film transistor PM2 are connected in series between the input terminal of the first inverter INV and the supply voltage (VDD).

Likewise, a first n-type thin film transistor NM1 and a second n-type thin film transistor NM2 are connected in series between the input terminal of the first inverter INV and the grounding potential.

An output voltage of the first inverter INV is applied to the gates (control electrodes) of the first p-type thin film transistor PM1 and the first n-type thin film transistor NM1, and an output voltage of the second inverter INV is applied to the gates of the second p-type thin film transistor PM2 and the second n-type thin film transistor NM2.

When the voltage that is applied to the gates of the first p-type thin film transistor PM1 and the first n-type thin film transistor NM1 is an output voltage of a j-th inverter, and the voltage that is applied to the gates of the second p-type thin film transistor PM2 and the second n-type thin film transistor NM2 is an output voltage of a k-th inverter, j<k=2n need to be satisfied where i is an odd number, and k is an even number. In FIG. 2, the positions of the first p-type thin film transistor PM1 and the second p-type thin film transistor PM2 can be replaced with each other. Also, in FIG. 2, the positions of the first n-type thin film transistor NM1 and the second n-type thin film transistor NM2 can be replaced with each other.

Figure 3:
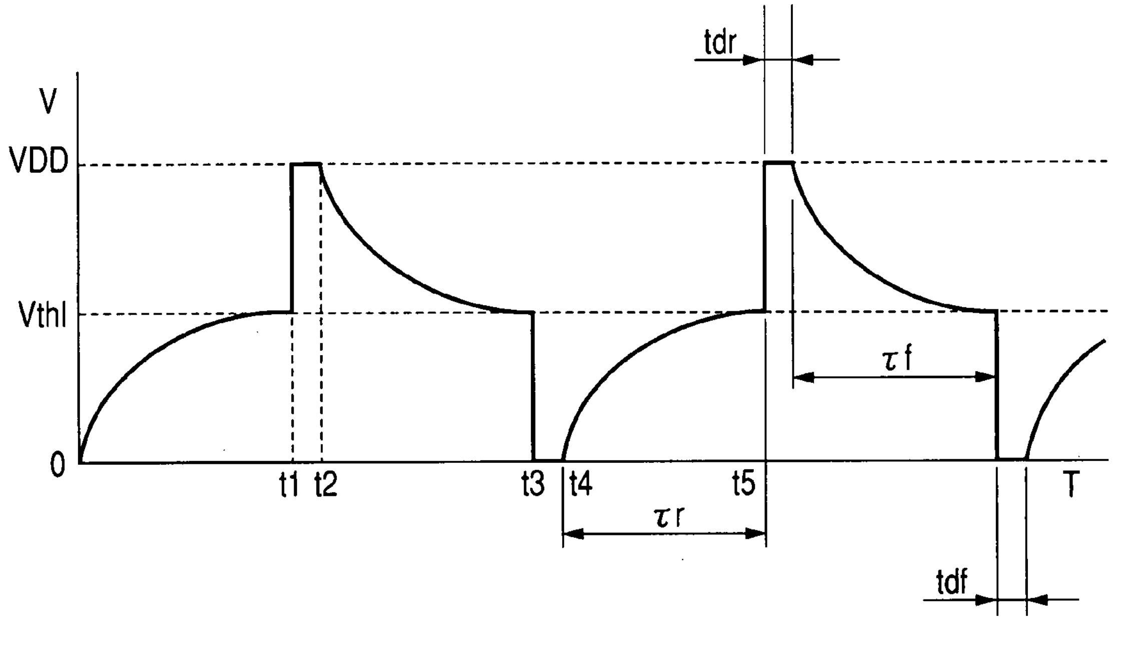
FIG. 3 is a schematic diagram showing a voltage waveform of a node (a) at the time of oscillation operation of the oscillator circuit shown in FIG. 2.

FIG. 3 is a schematic diagram showing a voltage waveform of a node (a) at the time of oscillation operation of the oscillator circuit shown in FIG. 2. The node (a) is an input voltage of the first inverter INV in the oscillator circuit shown in FIG. 2.

When the voltage of the node (a) reaches a logic threshold voltage VthL of the first inverter INV, the first inverter INV is logically inverted, and the output of the first inverter INV is changed from the H level to the L level.

In this instant, since the output of the second inverter INV is still of the L level, the first p-type thin film transistor PM1 and the second p-type thin film transistor PM2 turn on, and the node (a) is reset to the supply voltage VDD (t1 in FIG. 3).

Thereafter, the inverting operation of the inverter string connected in series is propagated, and the output of the second inverter INV is inverted from the L level to the H level.

In this situation, the second p-type thin film transistor PM2 turns off, the node (a) that has been fixed to the supply voltage VDD becomes in a floating state, and thereafter the node (a) starts the inversion from the H level to the L level through the (2n+1)-th inverter INV (t2 in FIG. 3).

In this example, when Z<<ZRd is satisfied where Z is an output impedance of the (2n+1)-th inverter INV, ZRd is a resistance of the resistor element Rd, and Ccd is a capacitance of the capacitor element Cd, the output of the first inverter INV becomes the H level at the time where the node (a) drops with the time constant of Ccd×ZRd, and reaches the logic threshold voltage VthL of the first inverter INV.

In this instant, since the output of the second inverter INV still has the H level, the first n-type thin film transistor NM1 and the second n-type thin film transistor NM2 turn on, and the node (a) is now reset to the grounding potential (0 V) (t3 in FIG. 3).

Thereafter, the inverting operation of the inverter string connected in series is propagated, and the output of the second inverter INV is inverted from the H level to the L level.

In this situation, the second n-type thin film transistor NM2 turns off, the node (a) that has been fixed to the grounding potential (0 V) becomes in a floating state, and thereafter the node (a) starts the inversion from the L level to the H level through the (2n+1)-th inverter INV (t4 in FIG. 3).

Then, the output of the first inverter INV changes to the logic threshold voltage vthL of the first inverter INV with the time constant of Ccd×ZRd (t5 in FIG. 3).

The above operation is one cycle at the time of oscillation.

In one cycle of the above-mentioned oscillation, a total (tdr+tdf) of the period of time tdr when the node (a) has been fixed to the supply voltage VDD and the period of time tdf when the node (a) has been fixed to the grounding potential (0 V) substantially corresponds to the propagation period of the inverter string. Also, a total (tf+tr) of the period of time tf during which the node (a) changes from the supply voltage VDD to the logic threshold voltage VthL of the first inverter INV and the period of time tr during which the node (a) changes from the supply voltage (0 V) to the logic threshold voltage VthL of the first inverter INV is determined according to the time constant of Ccd×ZRd.

(tdr+tdf) is affected by the characteristic variation of the p-type thin film transistor and the n-type thin film transistor which constitute the inverter.

On the contrary, (tf+tr) is held constant unless the logic threshold voltage VthL of the first inverter INV changes. Also, even if the logic threshold voltage VthL is shifted to the positive side or the negative side due to the characteristic variation of the p-type thin film transistor and the n-type thin film transistor, the charging and discharging of the node (a) due to ZRd×Ccd is temporally offset within one cycle of oscillation. As a result, the variation of (tf+tr) is reduced. For example, in the case where the logic threshold voltage VthL is large, tr becomes larger, but since tf becomes smaller, the variation of (tf+tr) is small.

In addition, because the period of time of the charging and discharging due to the time constant of ZRd×Cdd in the node (a) is irrelevant to the supply voltage, (tf+tr) is not affected by the supply voltage.

In this example, when the resistance ZRd of the resistor Rd, the capacitance Ccd of the capacitor element Cd, and the propagation period (tdr+tdf) of the inverter string are so set as to satisfy (tdr+tdf)<<(tf+tr) taking the variation of (tf+tr) into consideration, the oscillation period To becomes substantially (tf+tr), thereby making it possible to obtain the stable oscillation frequency with respect to the manufacture variation of the thin film transistor and the variation of the supply voltage. More specifically, when a relationship of (tdr+tdf)/(tdr+tdf+tf+tr)<0.1 is satisfied, the remarkable effects can be exerted. Also, even when a relationship of (tdr+tdf)<(tf+tr) is satisfied, given effects can be exerted.

Figure 4:
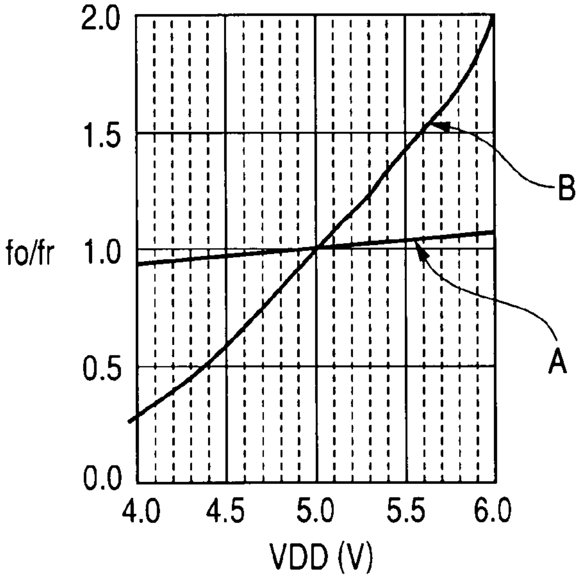
FIG. 4 is a graph showing an example of a relationship between the oscillation frequency and the supply voltage of the oscillator circuit shown in FIG. 2.

FIG. 4 is a graph showing an example of a relationship between the oscillation frequency and the supply voltage of the oscillator circuit shown in FIG. 2. Referring to FIG. 4, fr is the oscillation frequency when the supply voltage VDD is 5 V, and fo is the oscillation frequency when the supply voltage is an arbitrary supply voltage VDD. The axis of ordinate shows the regulation with respect to the oscillation frequency at the time of 5 V. The axis of abscissa is VDD.

Figure 5:
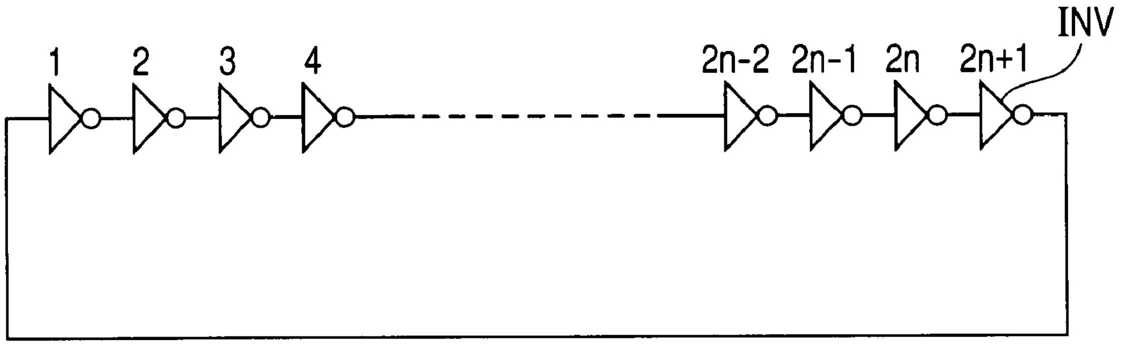
FIG. 5 is a circuit diagram showing the circuit configuration of a general oscillator circuit.

Also, a line A in FIG. 4 shows a relationship between the oscillation frequency and the supply voltage of the oscillator circuit shown in FIG. 2, and a line B in FIG. 4 shows a relationship between the oscillation frequency and the supply voltage of a general ring oscillator shown in FIG. 5. In this example, the number of inverters INV is identical between the line A of FIG. 4 and the line B of FIG. 4. It is found from FIG. 4 that the oscillator circuit shown in FIG. 2 is stabilized with respect to the supply voltage variation.

The above description is given of the embodiment in which the present invention is applied to the liquid crystal display device. However, the present invention is not limited to the liquid crystal display device, but the present invention is applicable to a display device such as an organic EL display device.

The above description was given in more detail of the invention made by the present inventors on the basis of the above embodiment, but the present invention is not limited to the above embodiment, and can be variously changed within a scope that does not deviate from the sprit of the invention.

What is claimed is:

1. A display device comprising:
a display panel having a plurality of pixels; and
a driver circuit that drives the plurality of pixels, respectively,
wherein the driver circuit includes an oscillator circuit,
wherein the oscillator circuit includes:
(2n+1) inverters having a first inverter to a (2n+1)-th inverter which are connected in series when n is an integer of 1 or larger;
an integrator circuit having an input terminal connected to an output terminal of the (2n+1)-th inverter and an output terminal connected to an input terminal of the first inverter;
first and second p-type transistors which are connected in series between the input terminal of the first inverter and a first reference potential; and
first and second n-type transistors which are connected in series between the input terminal of the first inverter and a second reference potential,
wherein an output voltage of a j-th inverter is applied to control electrodes of the first p-type transistor and the first n-type transistor,
wherein an output voltage of a k-th inverter is applied to control electrodes of the second p-type transistor and the second n-type transistor, and
wherein j is an odd number, and k is an even number, and j<k=2n is satisfied.

2. The display device according to claim 1,
wherein the integrator circuit includes:
a resistor element which is connected between the input terminal of the first inverter and the output terminal of the (2n+1)-th inverter; and
a capacitor element that is connected between the input terminal of the first inverter and the first reference potential or the second reference potential.

3. The display device according to claim 1,
wherein a relationship of (tdr+tdf)<(tf+tr) is satisfied:
when tdr is a period of time during which a voltage of the input terminal of the first inverter is fixed to the first reference potential;
when tdf is a period of time during which the voltage of the input terminal of the first inverter is fixed to the second reference potential;
when tf is a period of time during which the voltage of the input terminal of the first inverter is shifted from the first reference potential to a threshold voltage of the first inverter; and
when tr is a period of time during which the voltage of the input terminal of the first inverter is shifted from the second reference potential to the threshold voltage of the first inverter.

4. The display device according to claim 1,
wherein a relationship of (tdr+tdf)<<(tf+tr) is satisfied:
when tdr is a period of time during which a voltage of the input terminal of the first inverter is fixed to the first reference potential;
when tdf is a period of time during which the voltage of the input terminal of the first-inverter is fixed to the second reference potential;
when tf is a period of time during which the voltage of the input terminal of the first inverter is shifted from the first reference potential to a threshold voltage of the first inverter; and
when tr is a period of time during which the voltage of the input terminal of the first inverter is shifted from the second reference potential to the threshold voltage of the first inverter.

5. The display device according to claim 1,
wherein a relationship of (tdr+tdf)/(tdr+tdf+tf+tr)<0.1 is satisfied:
when tdr is a period of time during which a voltage of the input terminal of the first inverter is fixed to the first reference potential;
when tdf is a period of time during which the voltage of the input terminal of the first inverter is fixed to the second reference potential;

when tf is a period of time during which the voltage of the input terminal of the first inverter is shifted from the first reference potential to a threshold voltage of the first inverter; and when tr is a period of time during which the voltage of the input terminal of the first inverter is shifted from the second reference potential to the threshold voltage of the first inverter.

6. The display device according to claim 1, wherein each of the pixels has an active element, and the active element includes a thin film transistor having a semiconductor layer made of polysilicon.

7. The display device according to claim 1, wherein each of the inverters includes a thin film transistor having a semiconductor layer made of polysilicon.

8. The display device according to claim 2, wherein the capacitor element and the resistor element are incorporated into the display panel.

9. The display device according to claim 2, wherein the capacitor element and the resistor element are externally attached to the display panel.

* * * * *